United States Patent [19]
Botez et al.

[11] Patent Number: 6,167,073
[45] Date of Patent: Dec. 26, 2000

[54] HIGH POWER LATERALLY ANTIGUIDED SEMICONDUCTOR LIGHT SOURCE WITH REDUCED TRANSVERSE OPTICAL CONFINEMENT

[75] Inventors: Dan Botez, Madison, Wis.; Iulian Basarab Petrescu-Prahova, Bucharest, Romania; Luke J. Mawst, Sun Prairie, Wis.

[73] Assignee: Wisconsin Alumni Research Foundation, Madison, Wis.

[21] Appl. No.: 09/121,629

[22] Filed: Jul. 23, 1998

[51] Int. Cl.[7] .................................................. H01S 3/085
[52] U.S. Cl. ................................................. 372/46; 372/45
[58] Field of Search ................................ 372/45, 46, 50

[56] References Cited

U.S. PATENT DOCUMENTS

| | | | |
|---|---|---|---|
| 4,745,607 | 5/1988 | Koch | 372/45 |
| 4,860,298 | 8/1989 | Botez et al. | 372/45 |
| 4,985,897 | 1/1991 | Botez et al. | 372/50 |
| 5,101,413 | 3/1992 | Botez | 372/50 |
| 5,159,604 | 10/1992 | Mehuys et al. | 372/50 |
| 5,272,711 | 12/1993 | Mawst et al. | 372/45 |
| 5,606,570 | 2/1997 | Botez et al. | 372/50 |
| 5,818,860 | 10/1998 | Garbuzov et al. | 372/45 |

FOREIGN PATENT DOCUMENTS

WO 96/08062    3/1996    WIPO .

OTHER PUBLICATIONS

Botez, D., et al. "Resonant Optical Transmission and Coupling in Phase–Locked Diode Laser Arrays of Antiguides: The Resonant Optical Waveguide Array," Appl. Phys. Lett. 54(22), May 29, 1989, pp. 2183–2185.
Botez, D., et al., "Diffraction–Limited In–Phase–Mode Operation From Uniform Array of Antiguides With Enhanced Interelement Loss," Elec. Lett. 25(19), Sep. 14, 1989, pp. 1282–1283.
Botez, Dan, et al., "Phase–Locked Arrays of Antiguides: Modal Content and Discrimination," IEEE J. of Quantum Electronics, vol. 26, No. 3, Mar. 1990, pp. 482–495.
Botez, D., "High–Power Monolithic Phase–Locked Arrays of Antiguided Semiconductor Diode Lasers," IEEE Proc.–J., vol. 139, No. 1, Feb. 1992, pp. 14–23.
Mawst, L.J., et al., "Design Optimization of ARROW–Type Diode Lasers," IEEE Photonics Technology Letters, vol. 4, No. 11, Nov. 1992, pp. 1204–1206.
Mehuys, D., et al., "5.25–W CW Near–Diffraction–Limited Tapered–Stripe Semiconductor Optical Amplifier," IEEE Photonics Technology Letters, vol. 5, No. 10, Oct. 1993, pp. 1179–1182.
Botez, D., et al., Flat–Phasefront Fanout–Type Power Amplifier Employing Resonant–Optical–Waveguide Structures, Appl. Phys. Lett., vol. 63, No. 23, Dec. 6, 1993, pp. 3113–3115.

(List continued on next page.)

Primary Examiner—James W. Davie
Attorney, Agent, or Firm—Foley & Lardner

[57] ABSTRACT

A semiconductor structure for use as a laser or amplifier has a multilayer structure including a substrate, an active region, optical confinement and cladding layers on each side of the active region to surround the active region. The structure includes at least one core element at which light emission occurs and interelement regions laterally adjacent to the core element with the effective refractive index of the interelement regions higher than that of the core element to provide antiguiding of light emitted in the core element. The optical confinement and cladding layers on opposite sides of the active region have different indexes of refraction to provide an optical waveguiding structure in the transverse direction in the core element which is asymmetrical and which favors lasing only in the fundamental transverse mode. The structure allows larger core elements to be utilized than otherwise possible and results in a significantly increased light emission spot size enabling much higher emission power levels for lasers and higher saturation power levels for amplifiers.

22 Claims, 15 Drawing Sheets

OTHER PUBLICATIONS

Ramanujan, Sujatha, et al., "Temporal Behavior of Resonant–Optical–Waveguide Phase–Locked Diode Laser Arrays," Appl. Phys. Lett., vol. 64, No. 7, Feb. 14, 1994, pp. 827–829.

CLEO/IQEC '94 Advance Program, p. 52, Abstract entitled 'Uniform near–field flat–phase–front antiguided power amplifier with a three–core ARROW master oscillator, distributed prior to May 8, 1994.

Zmudzinski, C., et al., Three–Core ARROW–Type Diode Laser: Novel High–Power, Single–Mode Device, and Effective Master Oscillator for Flared Antiguided MOPAs, Technical Digest CLEO–Europe Conference, Paper CTuP3 Amsterdam, Netherlands, Aug.–Sep. 1994, pp. 169–170.

Mawst, L.J., et al., "Above–Threshold Behavior of High–Power, Single–Mode Antiresonant Reflecting Optical Waveguide Diode Lasers," Appl. Phys. Lett., vol. 66, No. 1, Jan. 2, 1995, pp. 7–9.

Botez, Dan, et al., "Phase–Locked Arrays of Antiguides: Analytical Theory II," IEEE Journal Quantum Electronics, vol. 31, No. 2, Feb. 1995, pp. 244–253.

Golster, I.V., "Single–Cladding Antiresonant Reflecting Optical Waveguide–Type Diode Laser," Optics Lett., vol. 20, No. 21, Nov. 1, 1995, pp. 2219–2221.

Buda, Manula, et al., "Analysis of 6–nm AlGaAs SQW Low–Confinement Laser Structures for Very High–Power Operation," IEEE Journal of Selected Topics in Quantum Electronics, vol. 3, No. 2, Apr. 1997, pp. 173–179.

Choquette, Kent D., IEEE Journal of Selected Topics in Quantum Electronics, vol. 3., No. 3, Jun. 1997, pp. 916–925.

Kawanaka, S., et al., "Strained Single Quantum Well AlGaInP Laser Diodes with an Asymmetric Waveguiding Layer," International Conference on Solid State Devices and Materials, Aug. 1, 1992, pp. 240–242.

Lelong, I.O., et al., "A Pulsed High–Power Quantum Well Laser Using an Asymmetric Waveguide," Semiconductor Science and Technology, vol. 11, No. 4, Apr. 1, 1996, pp. 568–570.

O'Brien, S., et al., "2.2–W Continuous–Wave Diffraction–Limited Monolithically Integrated Master Oscillator Power Amplifier at 854 nm," IEEE Photonics Technolgoy Letters, vol. 9, No. 4, Apr. 1, 1997, pp. 440–442.

Floyd, P.D., et al., "Low–Threshold Laterally Oxidized GaInP–AlGaInP Quantum–Well Laser Diodes," IEEE Photonics Technology Letters, vol. 10, No. 1, Jan. 1, 1998, pp. 45–57.

Tapered ARROW

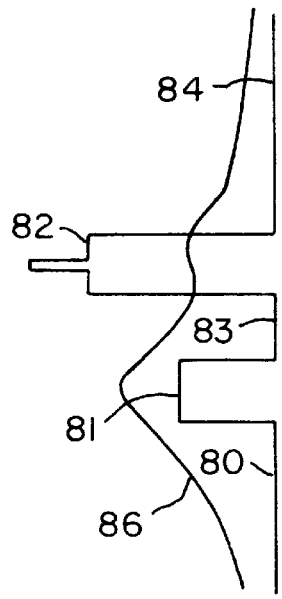
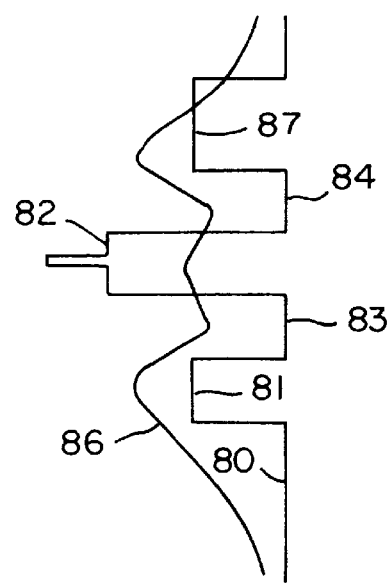
FIG. 15
FIG. 16
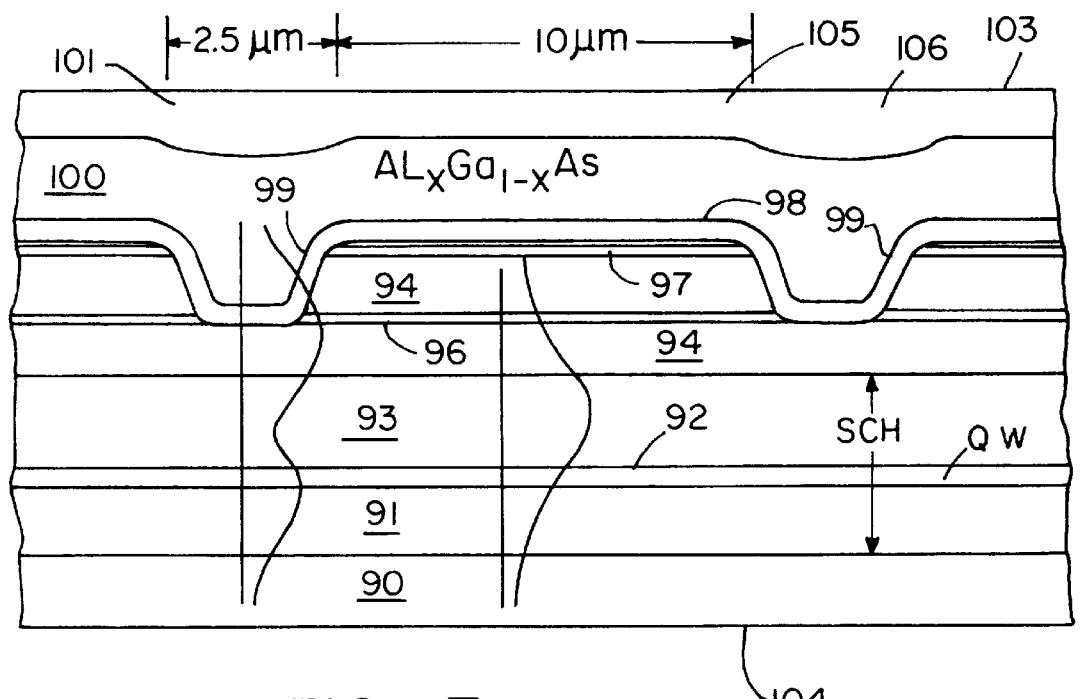
FIG. 17

| Layer No. | 1 | 2 | 3 | 4 | 5 | 6 | 7 | 8 | 9 | 10 | 11 | 12 |
|---|---|---|---|---|---|---|---|---|---|---|---|---|
| Al(%) | 0 | 40 | 20 | QW | 20 | QW | 20 | 30 | 0 | 30 | 0 | 30 |
| Thickness(E) | Sub. | — | 0.06 | 0.007 | 0.02 | 0.007 | 0.516 | 0.1 | 0.025 | — | 0.11 | — |
| Thickness(IE) | Sub. | — | 0.06 | 0.007 | 0.02 | 0.007 | 0.516 | 0.1 | 0.025 | 0 | 0.11 | — |

$\Gamma = 1.38\%$ $\Delta n = 0.01668$

Overlapping integral = 0.455

FIG. 19

HIGH POWER LATERALLY ANTIGUIDED SEMICONDUCTOR LIGHT SOURCE WITH REDUCED TRANSVERSE OPTICAL CONFINEMENT

This invention was made with United States government support awarded by the following agencies: NSF Grant Nos.: ECS-9522035; ECS-9622716. The United States has certain rights in this invention.

FIELD OF THE INVENTION

This invention pertains generally to the field of semiconductor diode lasers and amplifiers and particularly to antiguided diode lasers and amplifiers.

BACKGROUND OF THE INVENTION

Semiconductor diode lasers are formed of multiple layers of semiconductor materials. The typical semiconductor laser includes an n-type layer, a p-type layer, optical confinement layers and an undoped active structure between them such that when the diode is forward biased electrons and holes recombine in the active structure with the resulting emission of light. The layers surrounding the active structure typically have a lower index of refraction than the active structure and form a dielectric waveguide that confines the emitted light transversely to the active structure. Semiconductor lasers may be constructed to be either edge emitting or surface emitting.

To confine the emitted light laterally, positive-index guided or negative-index guided (antiguided) structures may be employed in a laser or amplifier diode array. In a positive-index guided structure the refractive index is highest in regions where the laser light has high field intensity and is low in regions of low field intensity, effectively trapping light within the high-index regions, i.e., the laser array elements. In a negative-index guided or antiguided structure, the refractive index is lowest and the optical gain is highest in regions where the laser light has maximum field intensity, i.e., the laser array elements, and the refractive index is highest and there is little or no optical gain in regions that contain relatively low field intensity. Consequently, some of the generated light will pass into the higher refractive index interelement regions and thus will not be confined to the lasing element regions, but this lost light is compensated for by the excess gain in the array element regions.

An array of laser emitters can typically oscillate in several possible modes. In a fundamental or in-phase array mode, all emitters oscillate in phase with each other, and a far field pattern is produced in which most of the energy is concentrated in a single lobe which is ideally diffraction limited. In general, there are many possible array modes for a multiple element array, and many laser arrays operate in two or three array modes simultaneously and produce beams that are typically two or three times wider than the diffraction limit. The problems associated with the operation of laser arrays at high power with high beam quality are discussed in U.S. Pat. No. 4,985,897, entitled Semiconductor Laser Array Having High Power and High Beam Quality. That patent describes a laser diode array structure, which may be implemented in an antiguided configuration, operated at or near the in-phase-mode resonance condition for which coupling occurs equally between all elements of the array.

The development of high-power (greater than one watt) coherent diode laser sources has been an area of continued research efforts. Positive index-guided single-element devices have been demonstrated up to about 0.6 watt (W) continuous wave (CW) coherent power, with reliable operation demonstrated to about 0.2 W, primarily being limited by the relatively small waveguide width of ≈3 μm. Single-element antiresonant reflecting optical waveguide (ARROW) lasers have also demonstrated single-mode optical power up to ≈0.5 W, with the added benefit of a drive-independent beam pattern, due to strong lateral optical-mode confinement in devices of 4–6 μm aperture width. See L. J. Mawst, D. Botez, C. Zmudzinski, and C. Tu, "Design optimization of ARROW-type diode lasers,"IEEE Photon. Technol. Lett., Vol. 4, pp. 1204–1206, November 1992. In fact, single-mode ARROW devices with aperture width of up to 10 μm are possible, which should allow for reliable powers of ≈0.5 W CW from devices with nonabsorbing mirrors.

Research on phase-locked diode laser arrays in an attempt to increase the aperture width and operating power met with little success in controlling the complicated mode structure until the development of resonant-optical-waveguide (ROW) antiguided arrays. Such arrays are described in D. Botez, L. J. Mawst, G. L. Peterson, and T. J. Roth, "Phase-locked arrays of antiguides: Modal content and discrimination,") IEEE J. Quantum Electron., Vol. 26, pp. 482–495, March 1990. Antiguided arrays have demonstrated near-diffraction-limited CW operation at 1 W from a 120 μm aperture, with up to 0.6 W in the central lobe of the far-field emission pattern, and reliable operation over 3500 hours has been achieved at 0.5 W CW output, thus making ROW arrays the only high-power coherent device type to date that has demonstrated long-term reliability. However, since such devices are based on meeting a (lateral) optical resonance condition, the fabrication tolerances on their structural parameters have been experimentally and theoretically determined to be very tight, especially as the number of elements increases. See D. Botez, A. Napartovich, and C. Zmudzinski, "Phase-locked arrays of antiguides: Analytical theory II,") IEEE J. Quantum Electron., Vol. 31, pp. 244–253, February 1995.

A semiconductor laser having antiguide elements and interelement structures with high loss coefficient is described in U.S. Pat. No. 5,606,570 to Botez, et al., entitled High Power Antiguided Semiconductor Laser with Interelement Loss. Such a structure can be used to provide excellent discrimination between the resonant in-phase mode and the unwanted nonresonant modes, and allows relatively large fabrication tolerances.

Currently, in symmetric transverse waveguide lasers, the power can be significantly increased by increasing the waveguide for the same quantum-well(s) size. In turn, the transverse optical confinement factor $\Gamma$ (the percent of light energy in the active region) decreases significantly, which, in turn, provides a large equivalent transverse spot size, $d/\Gamma$, where d is the quantum-well(s) total thickness. The lowering of $\Gamma$ does not significantly affect the threshold-current density as long as the internal loss coefficient is small ($1-2$ cm$^{-1}$), and the cavity length is increased roughly in the same proportion that $\Gamma$ was decreased. Using such structures, very high spatially incoherent powers (e.g., 8–10 W CW) have been achieved from broad-stripe (100 μm) devices. However, since transversely the optical mode hardly penetrates into the cladding layers, it is practically impossible to obtain effective lateral mode confinement for 2-D spatial-mode coherence.

SUMMARY OF THE INVENTION

In accordance with the present invention, semiconductor light emitting sources such as lasers and amplifiers are formed in multilayer semiconductor structures that incorporate antiguided lateral confinement of emitted light. The semiconductor structure of the invention also incorporates an asymmetric transverse optical waveguiding structure to provide a large equivalent transverse spot size. In addition, the effects of intra element gain spatial hole burning are significantly reduced, allowing the core elements to be made significantly larger than conventional cores. These features enable semiconductor light sources having a significantly increased overall spot size as compared to similar semiconductor structures formed in a conventional manner. Spot sizes up to five times larger than conventional structures are quite feasible, enabling five times more reliable power for semiconductor lasers incorporating such structures or five times higher saturated power $P_{sat}$ for semiconductor amplifiers.

The semiconductor light emitting source of the invention is comprised of a multilayer semiconductor structure including, in the transverse direction, a substrate, an active region, and confinement and cladding layers on each side of the active region to surround the active region. At least one core element or element region is formed laterally in the structure at which light emission primarily occurs and interelement regions are formed adjacent to the core element. The core element has a selected effective refractive index for the emitted light and the effective refractive index of the interelement regions is higher than that of the core element to provide effective antiguiding of light generated in the active region. The optical confinement and cladding layers on opposite sides of the active region have different indexes of refraction to provide an optical waveguiding structure in the transverse direction in the core element which is asymmetrical and which favors lasing only in the transverse fundamental optical mode. Preferably, the optical confinement and cladding layers provide an optical confinement factor in the active region of less than about 2%, and wherein there is an effective refractive index step between the core element and the interelement regions lower than about 0.05 and an attenuation coefficient in the interelement regions lower than about 100 $cm^{-1}$. Where the semiconductor source is to be operated as a laser, means for providing optical feedback are incorporated in the structure to provide lasing action in the core elements. For incorporation in an amplifier, facets at the longitudinal edges of the semiconductor structure are formed to be sufficiently anti-reflective so that the semiconductor source operates as an amplifier.

The present invention can be configured using various lateral antiguided structures, including as a simplified ARROW structure, as a single core element ARROW structure, or as a multicore (e.g., three) ARROW structure. Plural core elements may be separated by interelement regions to define a ROW array. If desired, the ARROW structure may be tapered longitudinally so that the core element is wider at one edge of the structure than at the other edge. Various means may be provided in the semiconductor structure to restrict current applied to the structure to the core element.

Further objects, features and advantages will be apparent from the following detailed description when taken in conjunction with the accompanying drawings.

BRIEF DESCRIPTION OF THE DRAWINGS

In the drawings:

FIG. 15 is a simplified diagram of transverse index of refraction profile and optical mode profile of a core element having a narrow light trap separated from a narrow active region.

FIG. 16 is a simplified diagram of transverse index of refraction profile and optical mode profile for the interelement structures adjacent to the core element of FIG. 15.

FIG. 17 is an exemplary cross-sectional view through a semiconductor source structure in an AlGaAs based system comprising a single-clad ARROW structure.

FIG. 19 is a table showing exemplary layer thicknesses and Al percentages for each of the layers in the semiconductor structure of FIG. 18 (top row) as well as for those for an interelement region (bottom row).

DETAILED DESCRIPTION OF THE INVENTION

Figure 1:
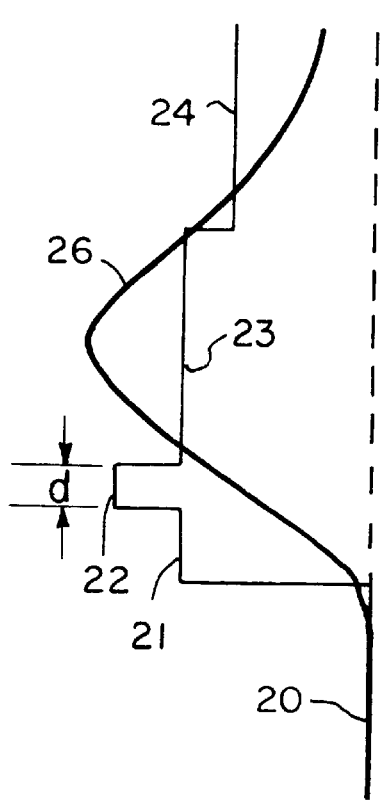
FIG. 1 is a simplified diagram illustrating the profile of the index of refraction and the optical mode profile in the transverse direction in the light emitting core element of the semiconductor source of the invention.
Figure 2:
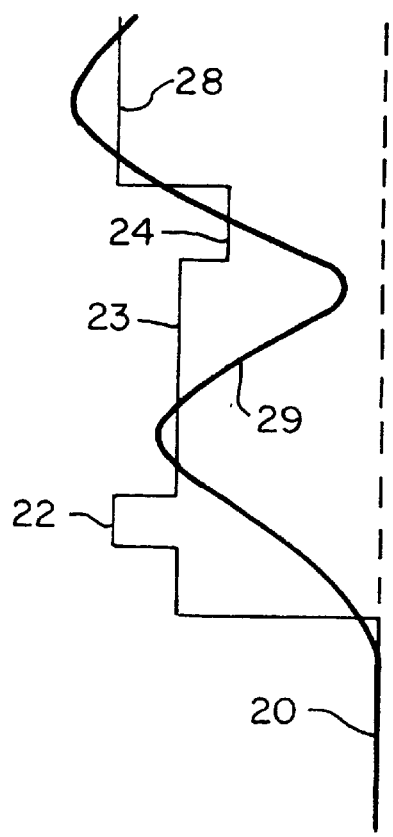
FIG. 2 is a simplified diagram illustrating the index of refraction profile and the optical mode profile in the transverse direction in the interelement regions that are adjacent to the core element (or elements) in the semiconductor source of the invention.

The present invention allows the attainment of higher power levels in semiconductor lasers and amplifiers (generally referred to herein as semiconductor sources) by achieving lateral mode confinement for two-dimensional spatial-mode coherence. Large transverse spot size (d/Γ) as well as strong lateral mode confinement are obtained utilizing an asymmetric transverse optical waveguiding structure. A simplified diagram illustrating an exemplary asymmetric transverse index of refraction profile in the core element of the source structure of the invention is illustrated in FIG. 1. The index of refraction is at a first level 20 in a lower cladding layer, at a second higher level 21 in a confinement layer, at a higher index level 22 in the active region (which is of width d), at a level 23 (which is the same as the level 21) in the top confinement layer adjacent to the active region, and at a lower level 24 in an upper cladding layer that is at a higher level than the lower cladding index level 20. The thickness of the upper confinement layer 23 is also preferably greater than that of the lower confinement layer 21. The result is an optical mode profile illustrated by the graph 26. Such a structure allows lasing only in a single (optical) transverse mode which has a d/Γ value at least three times higher than that of conventional symmetric-guide laterally antiguided coherent laser structures. The core element, the profile of which is illustrated in FIG. 1, is bounded laterally by interelement regions which, for an antiguided structure in accordance with the invention, have a higher effective refractive index than that of the core element. As illustrated in FIG. 2, the index profile in the interelement region may have the same layers of index levels 20, 21, 22, 23 and 24 as the core element and an additional layer of high refractive index level 28 which provides a higher effective refractive index for the entire interelement or boundary region than that of the core element. The optical mode profile in the interelement region is illustrated by the graph 29 in FIG. 2. As illustrated in FIGS. 1 and 2, there is sufficient field overlap between the fields in the core element and the interelement regions to provide adequate lateral antiguiding.

A semiconductor source structure with a core element having an asymmetric index profile, as illustrated in FIG. 1, bounded by higher effective index interelement regions, as illustrated in FIG. 2, has two main advantages due to its relatively small Γ value, the first being a large equivalent transverse spot size, d/Γ, and the second being that the effects of intraelement gain spatial hole burning are significantly reduced, allowing the core elements to be larger than in conventional laser structures by a factor proportional to $1/\sqrt{\Gamma}$. For example, if Γ is reduced three times from 4.3% (typical for conventional laser structures) to 1.3%, then d/Γ triples and the core element size can be increased by a factor of $\sqrt{3}$. Thus, the overall spot size increases by a factor of about 5. A five times larger spot size implies that five times more reliable power can be obtained for lasers and a five times higher saturation power, $P_{sat}$, can be obtained for amplifiers. As an example, for typical 3 μm wide ridge-guide type devices, with nonabsorbing mirrors, the typical reliable single-mode power level is about 0.2 W. Thus, for an aperture five times larger, reliable operation in a single spatial mode can be obtained at five times this power, e.g., 1 W continuous wave (CW).

Figure 3:
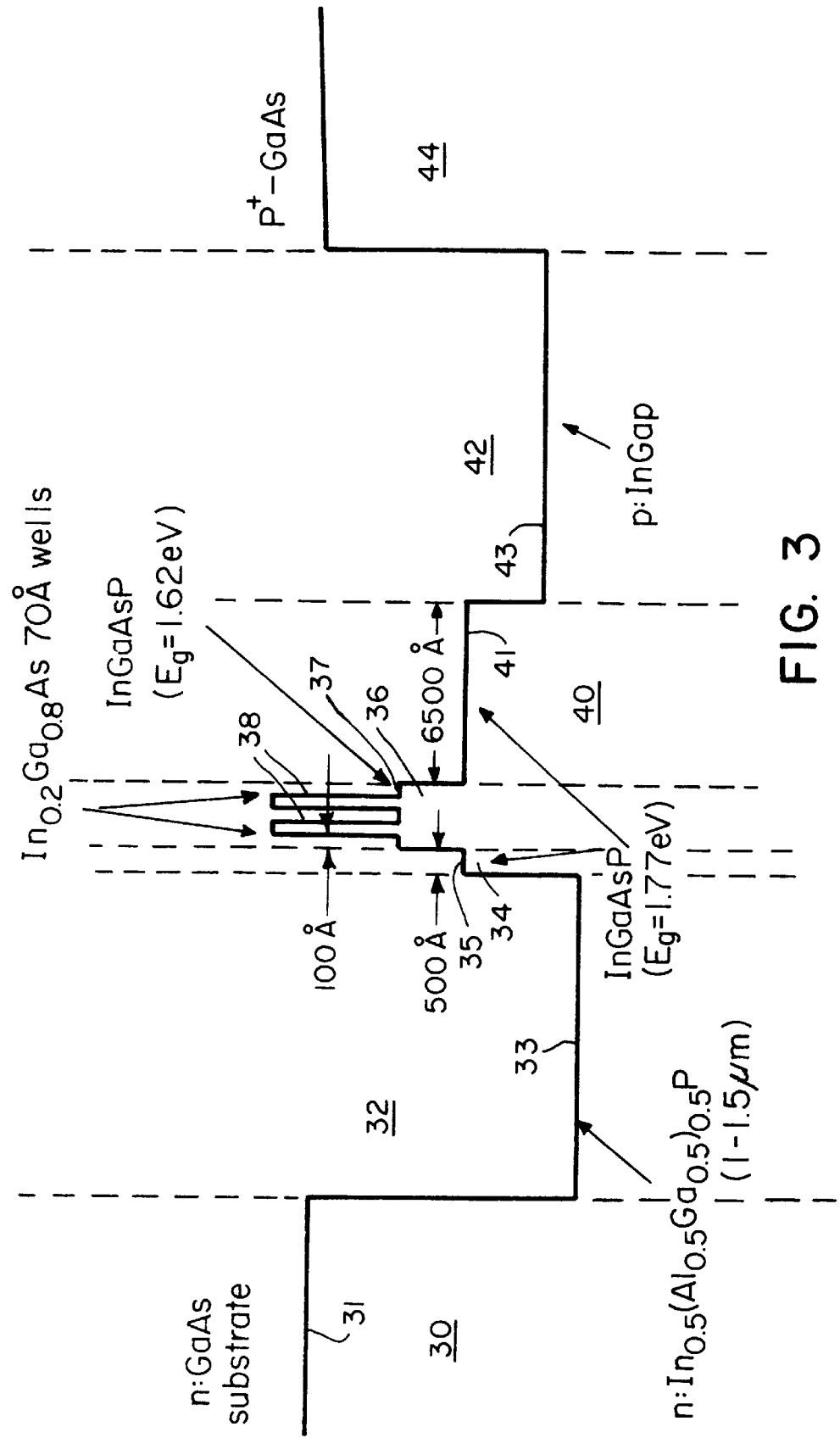
FIG. 3 is a diagram of an exemplary transverse index profile in the core element of a semiconductor source laser of the invention having an InGaAsP active region with InGaAs double quantum wells.
Figure 4:
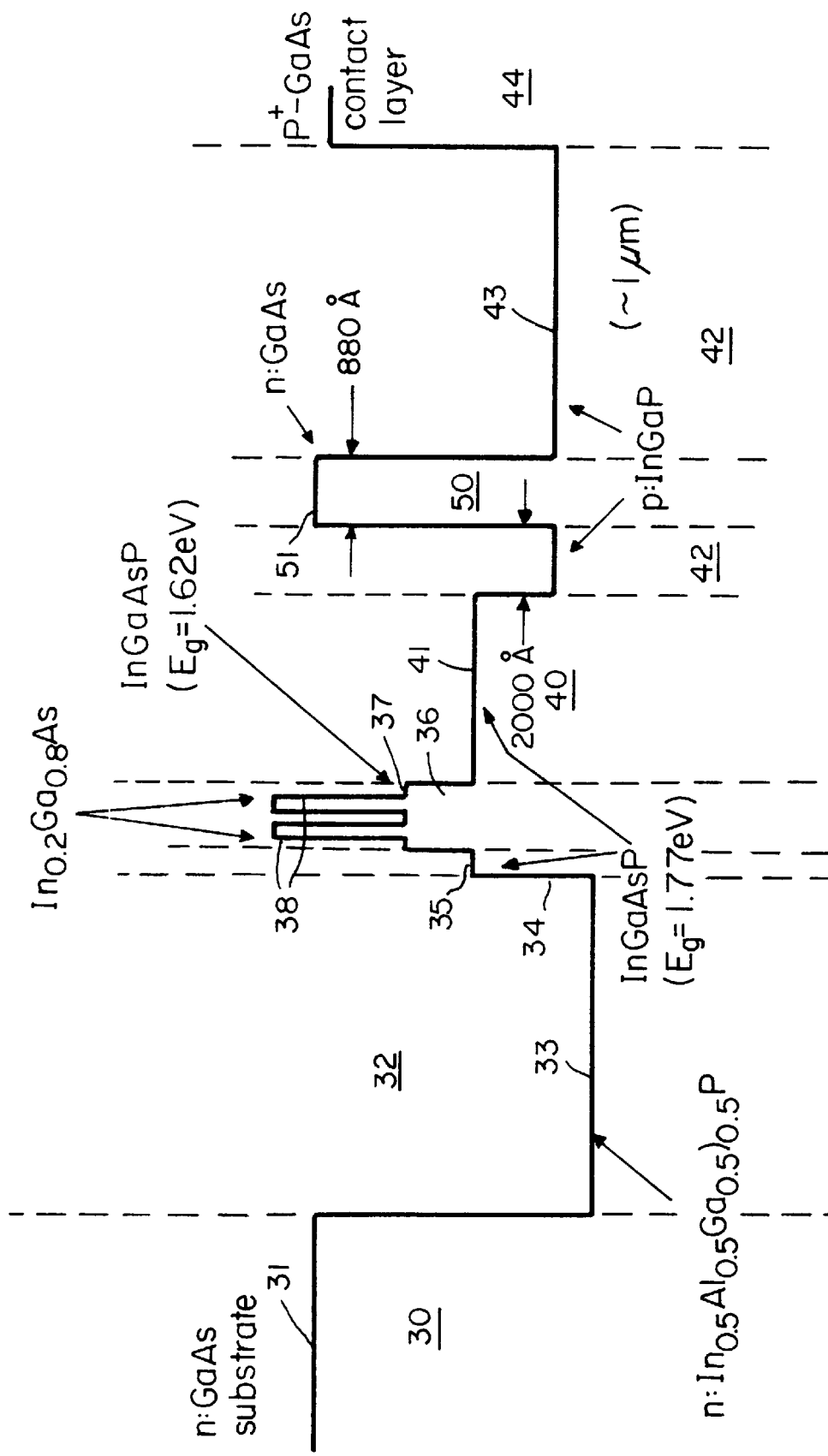
FIG. 4 is a diagram of an exemplary transverse index profile in the higher effective refractive index interelement regions that are adjacent to the core element having the profile shown in FIG. 3.
Figure 5:
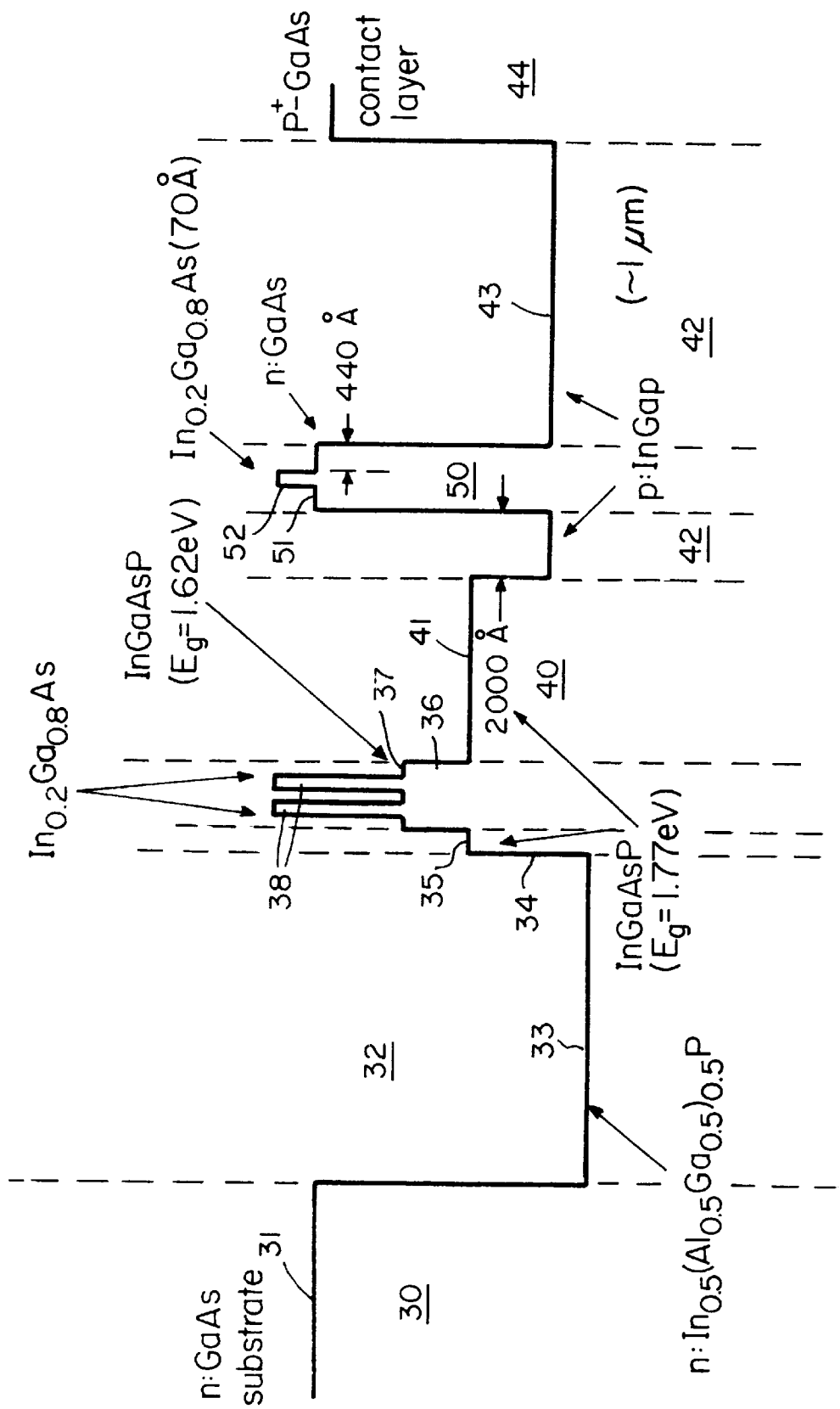
FIG. 5 is a diagram of another exemplary transverse index profile in the higher effective refractive index interelement regions that are adjacent to the core element having the profile shown in FIG. 3.

A first exemplary embodiment of the invention is illustrated in FIG. 3, which is an aluminum free active region structure ideally suited for the etch and regrowth techniques that are needed to make large lateral spot size antiguided structures. The exemplary structure of FIG. 3 includes a substrate 30 of n-type GaAs having a refractive index level 31, a lower cladding layer 32 of n-type $In_{0.5}(Al_{0.5}Ga_{0.5})_{0.5}P$ having a lower index of refraction level 33 (with a width of e.g., 0.7 to 1.5 μm), a lower confinement layer 34 of InGaAsP having an index level 35 and a width of, e.g. 500 Å, an active region 36 having an index level 37 for InGaAsP barrier layers and a double well quantum structure, each well formed of $In_{0.2}Ga_{0.8}As$ (with exemplary dimensions of 70 Å for each of the wells and 100 Å spacing between the wells 38 and between the wells and the edges of the active region), an upper confinement layer 40 having an index level 41 (e.g., 6500 Å wide), and an upper cladding layer 42 having an index level 43. It is understood, of course, that reference to "upper") and "lower") are for convenience only, and simply distinguish between layers on one side or the other of the active regions. As illustrated, the index level 43 of the upper cladding layer 42 is higher than the index level 33 of the lower cladding layer 32. The upper cladding layer 42 is formed of p-type InGaP. The index profile of an exemplary interelement region is illustrated in FIG. 4. The structure of the interelement region is similar to that of the core element except for the addition of a layer 50 of n-type GaAs within the upper cladding layer 42 having a higher level 51 of index of refraction than the index level 43 of the cladding layer 42. An alternative interelement region index profile is shown in FIG. 5. It is similar to that shown in FIG. 4 except that the layer 50 of n-type GaAs includes a thin layer 52 of $In_{0.2}Ga_{0.8}As$ (e.g., 70 Å wide) within the layer 50. The layer 50 provides a greater effective index of refraction for the interelement region than the effective index of the core element. Layer 52 in FIG. 5 introduces interelement absorption loss for devices that need it for intermodal discrimination (e.g., triple-core ARROW laser structures). A p+ type GaAs contact layer 44 may be formed on top of the cladding layer 42.

The structure of FIG. 3 is designed to favor lasing only in the fundamental transverse optical mode. To assure asymmetry, the lower cladding layer 32 is n-type InGaAlP, a material of higher band gap and lower index of refraction than the upper cladding layer 42 (of p-type InGaP).

Figure 7:
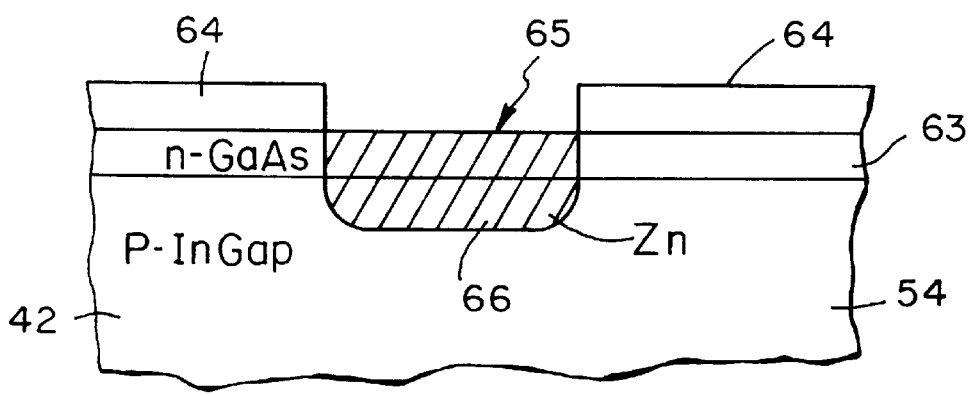
FIG. 7 is a partial cross-sectional view of a portion of an exemplary current blocking structure for the source of FIG. 6.
Figure 6:
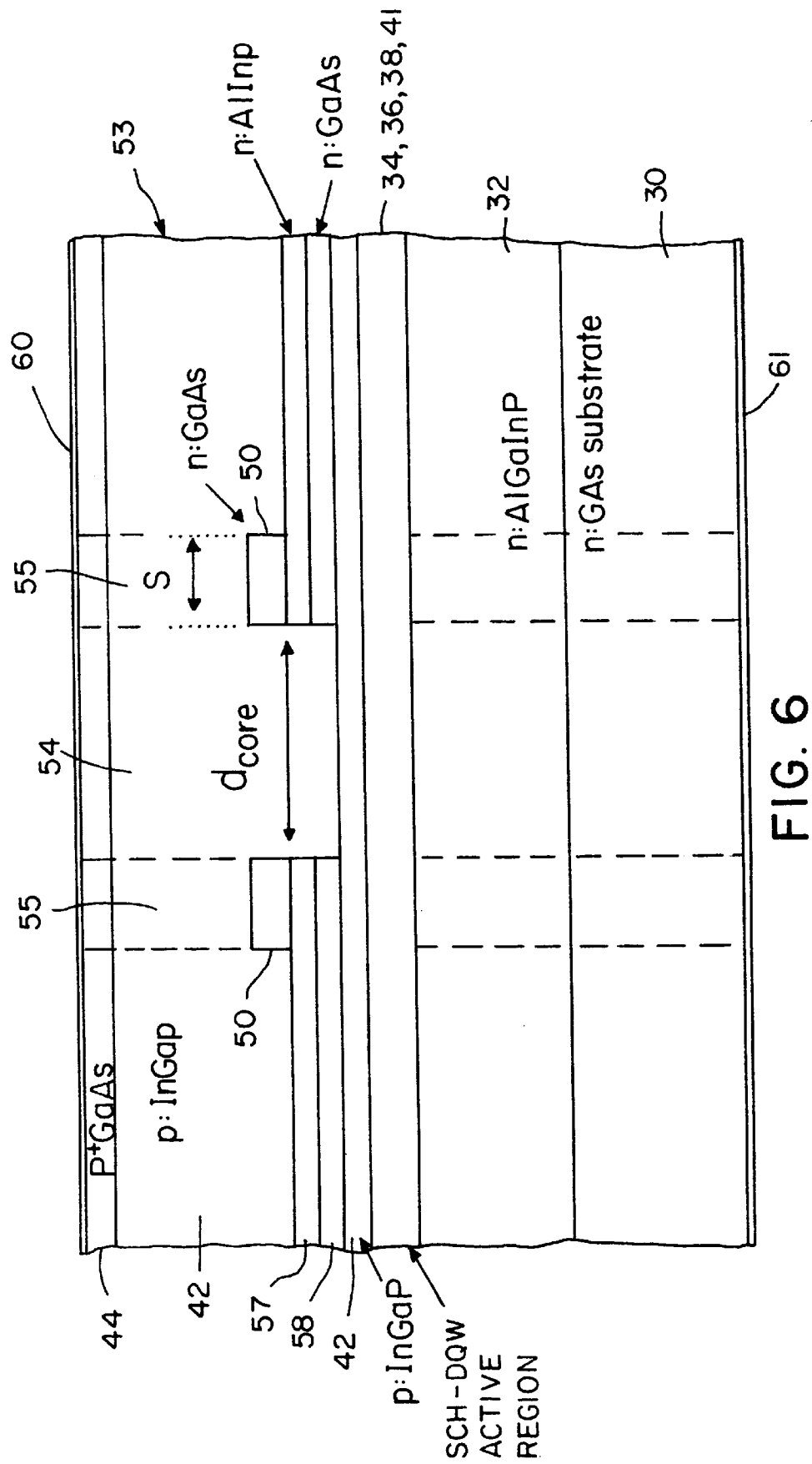
FIG. 6 is an illustrative cross-sectional view through a semiconductor source in accordance with the invention having a simplified ARROW (S-ARROW) lateral configuration.

The transverse structures illustrated in FIGS. 3, 4 and 5 may be utilized in various lateral geometries in accordance with the invention. A first such lateral structure is a simplified ARROW (S-ARROW) configuration illustrated at 53 in FIG. 6. The S-ARROW configuration is an ARROW structure with only one antiresonant interelement region on each side of the single core element. As used herein, the interelement regions may be located at the lateral boundaries of a single core element, or may be between multiple core elements and at the boundaries of the outermost elements. The S-ARROW structure has the advantage of being much simpler to fabricate than conventional single core ARROW or multiple core ARROW devices, and it has only two competing lateral modes so that it is relatively easy to obtain effective intermodal discrimination. The core element 54 may be formed having the layer structure illustrated in FIG. 3, utilizing a separate-confinement-heterostructure (SCH) double-quantum-well (DQW) active region. It is bounded by interelement regions 55 whose layer structure is shown in FIG. 4, which in this case serve as boundary regions since there is a single core element, and the interelement regions include the higher index region 50 as well as additional layers of n-type AlInP 57 and n-type GaAs 58 which extend across the entire structure. The n-type regions 57 and 58 provide a back biased n-p junction with the p-type layer 42. Thus, when voltage is applied between conductive electrodes 60 and 61 formed on the opposite faces of the semiconductor structure 53 to supply current across the structure, the current is restricted by the back biased p-n junctions to the core element 54 so that light emission occurs in the quantum well layers 38, embedded in the active region 36, primarily or entirely in the core element. Various other alternative means for restricting the current flow to the core element may be utilized. These include incorporating an oxide layer at the top of the p+-GaAs layer 44 that has a stripe-shaped opening above the core element 54, the stripe opening having a width that is narrower than the width of the core (e.g., 7 µm stripe width for $d_{core}$=10 µm) and centered above the core. Thus, when current is applied to the electrode 60 the current flows only through the oxide-defined stripe contact. Another alternative is illustrated in FIG. 7 in which a layer of n-type GaAs is formed at the top of the layer 42 of p-type InGaP to form a back biased p-n junction. An oxide layer 64 may be formed over the entire structure except at an opening 65 at which a conductive impurity material (e.g., Zn) may be diffused through the opening 65 and through the p-n junction between the layers 63 and 42 to define a conductive contact region 66, as illustrated in FIG. 7, that extends through the p-n junction and lies above the core element 54. Another means to restrict current flow to the core element is to exploit the technique of selective wet oxidation of AlGaAs. This is discussed in, e.g., K. D. Choquette, K. M. Geib, C. I. H. Ashby, R. D. T. Westen, 0. Blum, H. Q. Hou, D. M. Follstaedt, B. E. Hammons, D. Mathes, R. Hull, "Advances in Selective Wet Oxidation of AlGaAs Alloys,") IEEE J. Selected Topics in Quantum Electronics, Vol. 3, No. 3., June 1997, pp. 916–925. Selectively oxidized thin layers of Al-containing compound can be formed on at least one side of the active region to define a stripe opening or openings adjacent the core element region. For example, a layer of high Al content ($x \geq 0.95$) $Al_xGa_{1-x}As$ can be embedded within the upper or lower cladding layers (layers 42 or 22 in FIG. 6), or used to replace layer 57 in FIG. 6. Post-growth processing involves selective wet oxidation of the $Al_xGa_{1-x}As$ layer outside the core element, initiated from the lateral edges of the device structure.

The boundary interelement regions 55 function as lateral cladding regions for the simplified ARROW structure 53 and are selected to correspond approximately to the antiresonance condition for the fundamental lateral mode. The high index interelement cladding regions 55 support both even and odd transverse modes, which cause lateral antiguidance and guidance, respectively. The theory and construction of such simplified core ARROW structures is discussed further in I. V. Goltser, L. J. Mawst, and D. Botez, "Single-Cladding Anti-Resonant Reflecting Optical Waveguide-Type Diode Laser,") Optics Letters, Vol. 20, No. 21, Nov. 1, 1995, pp. 2219–2221.

Figure 8:
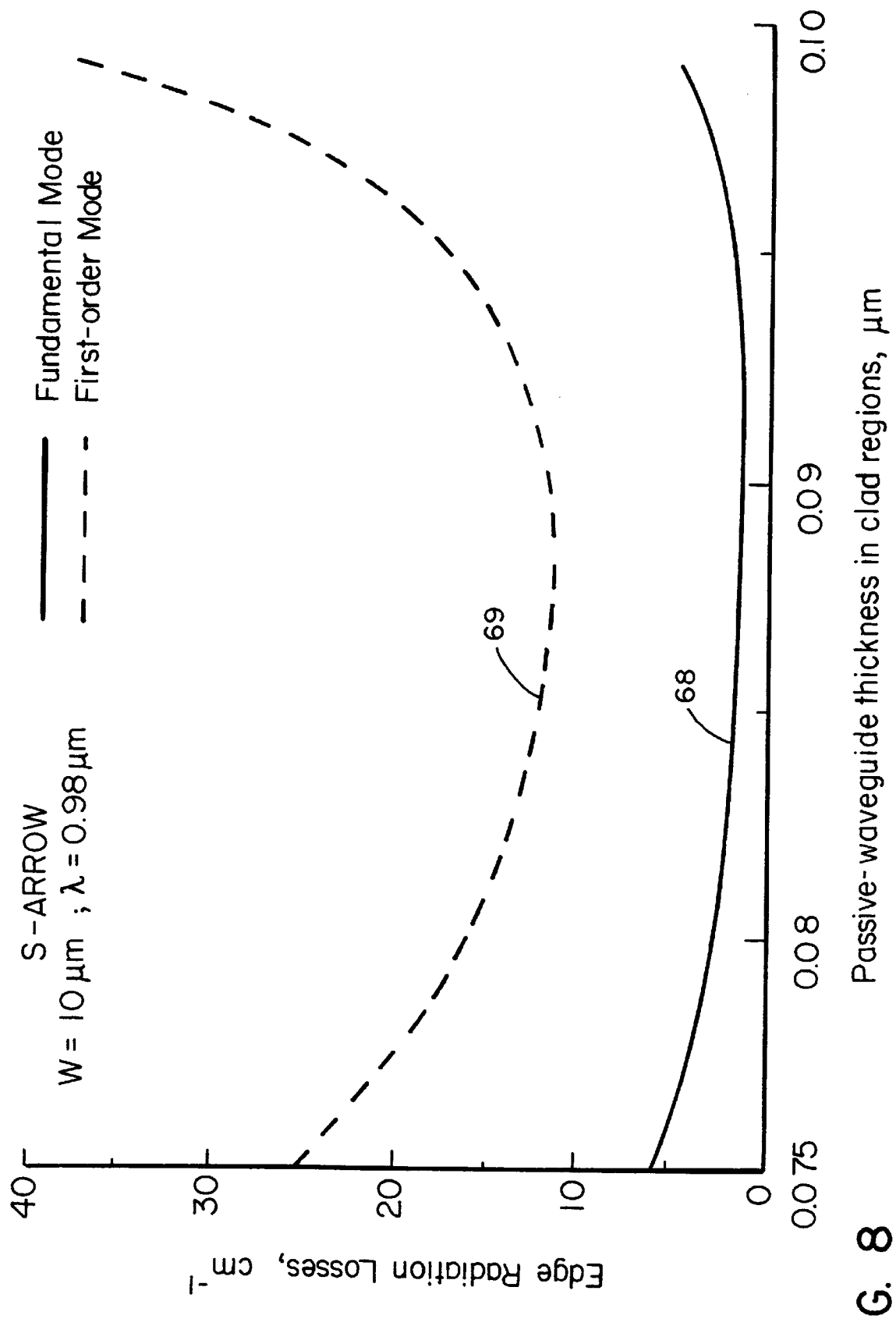
FIG. 8 are graphs illustrating calculated edge radiation losses as a function of passive waveguide thickness in the clad regions for the fundamental mode and the first order mode for the source of FIG. 6.

An example of this structure was modeled, utilizing the MODEM code for two-dimensional (2D) calculations described in D. Botez, "High-Power Monolithic Phase-Locked Arrays of Antiguided Semiconductor Diode Lasers,") Proc. IEE - J, Vol. 139, No. 1, February 1992, pp. 14–23. The following key parameters are used: Γ=1.45%, $d_c$=10 µm, interelement region width s=2.55 µm, and index step Δn=0.022. Calculated graphs showing edge radiation losses are shown in FIG. 8 for the fundamental mode at 68 and for the first order mode at 69. Such calculations show a discrimination of 10 to 15 cm$^{-1}$ over a wide range in the GaAs passive waveguide thickness. For the exemplary structure of the invention, $d_c$=10 µm and $d_{active}/\Gamma$ is approximately equal to 1.0 µm. In comparison, for a conventional simplified ARROW (S-ARROW) with $d_c$=4–6 µm, and Γ=4.3%, $d_{active}/\Gamma$ is about equal to 0.3 µm. Thus, for the exemplary structure of the invention, the lasing spot is 1.7 times larger laterally and three times larger transversely than the conventional S-ARROW, i.e., the lasing spot is five times greater in area than that for a conventional S-ARROW structure.

It is understood that mirrored facets may be provided at the longitudinal end edges of the structure to provide optical feedback for lasing action in a conventional manner. Alternately, feedback may be provided by a buried DFB grating in case single-frequency operation is needed as well.

Figure 9:
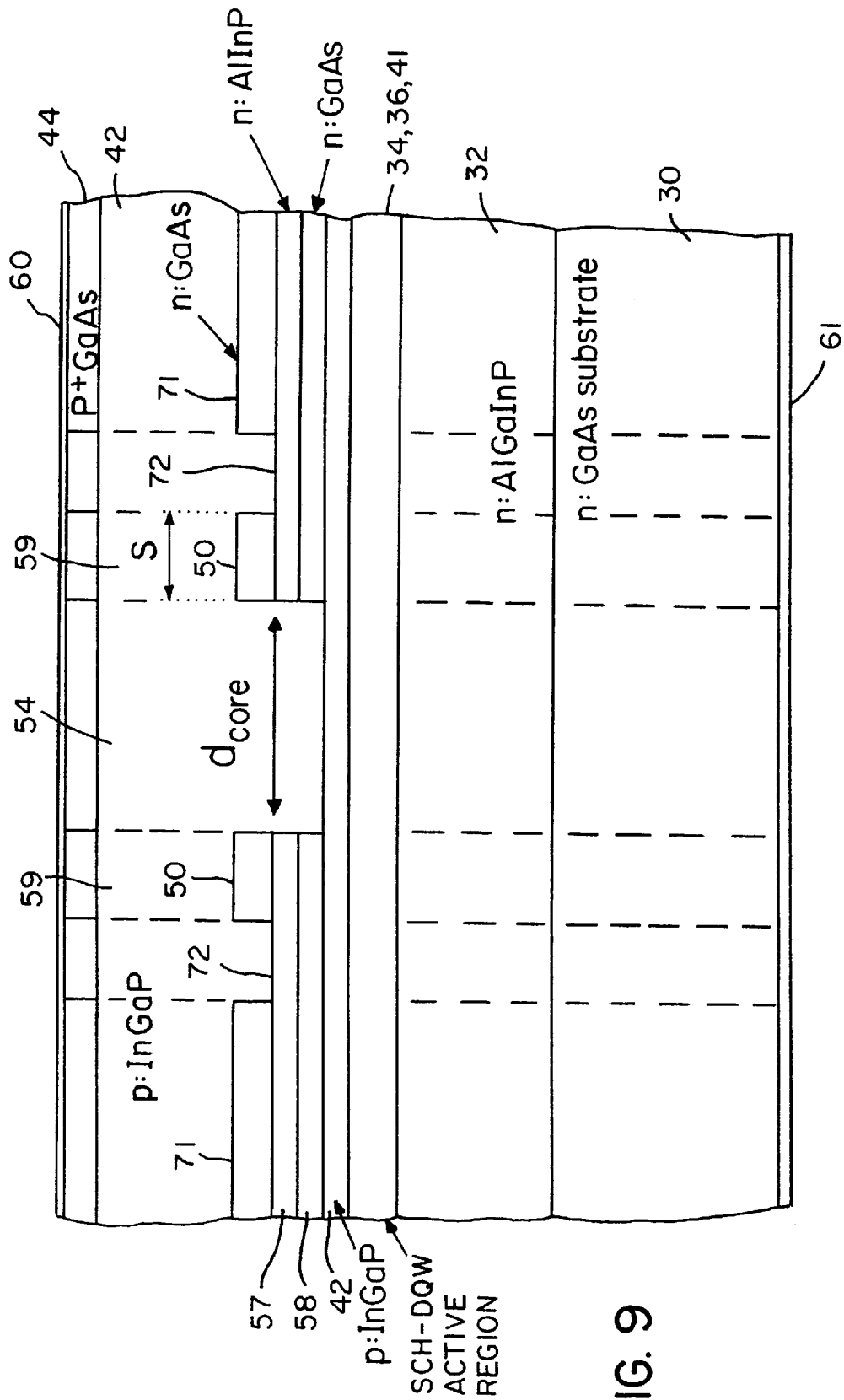
FIG. 9 is an illustrative cross-sectional view through a semiconductor source in accordance with the invention having a single core and an ARROW lateral structure.
Figure 10:
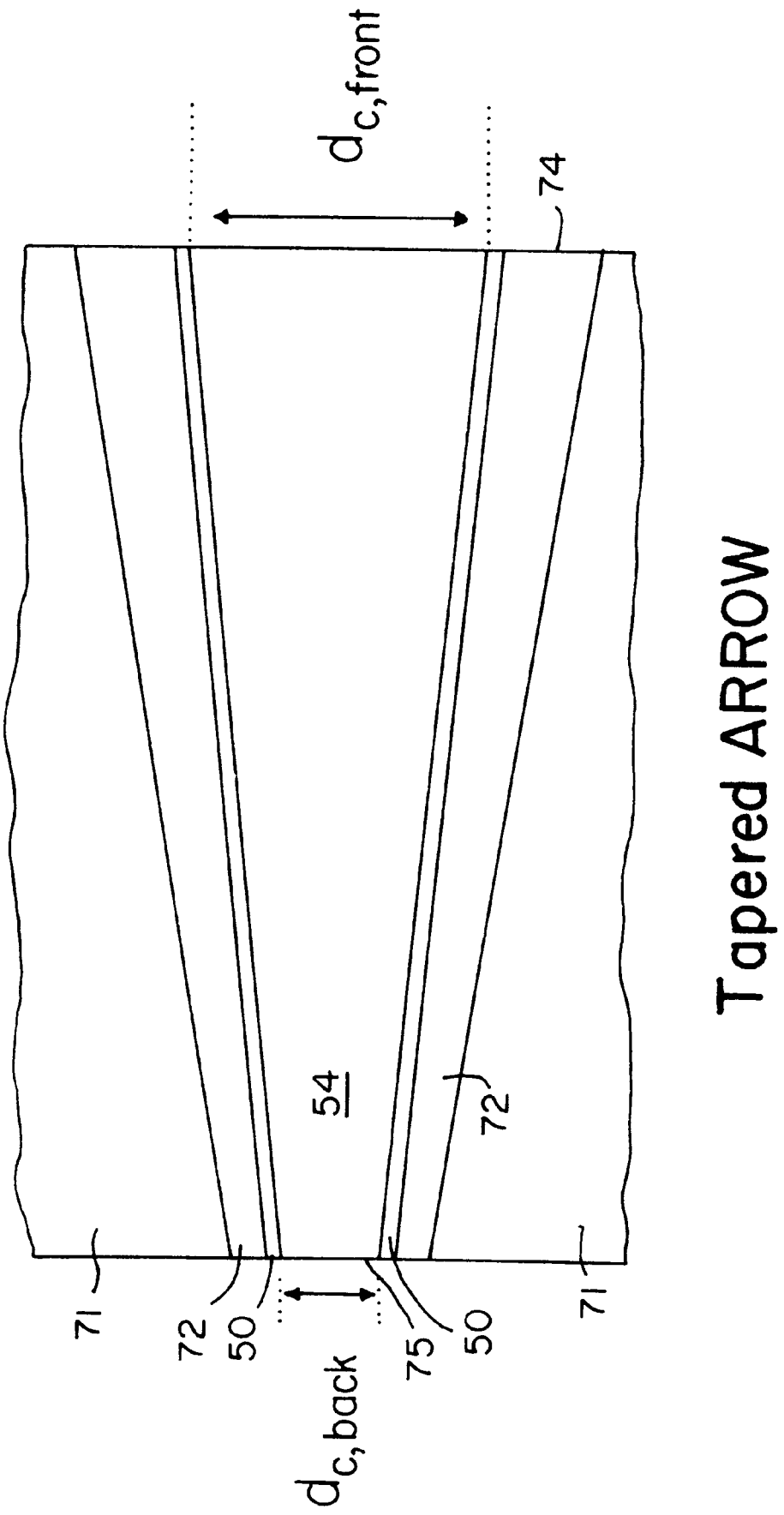
FIG. 10 is a plan view of the core element and adjacent elements for an ARROW structure as in FIG. 9 which has tapered lateral dimensions.

A conventional ARROW structure with a single core element 54 is illustrated in FIG. 9. In this conventional structure, an additional layer 71 of n-type GaAs is formed over the layers 57 and 58 and is spaced from the layer 50 by an opening 72. The structure of FIG. 9 may be longitudinally uniform or, as illustrated in FIG. 10, tapered such that the width $d_c$ of the core element 54 at the front edge 74 of the laser structure is greater than at the back edge 75. The edges 74 and 75 may be mirrored facets for optical feedback.

Figure 11:
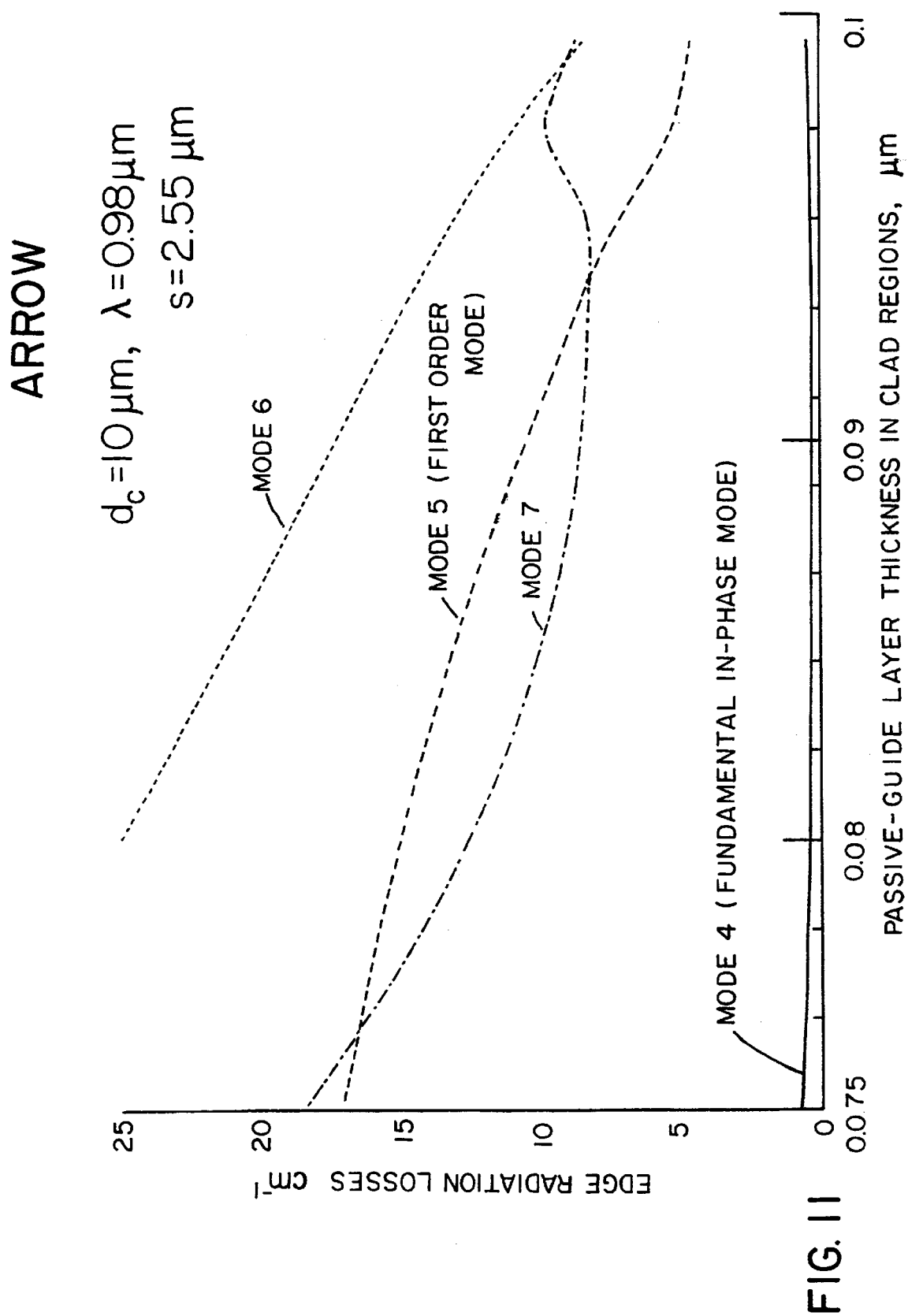
FIG. 11 are graphs illustrating calculated edge reflection losses versus passive waveguide thickness in the clad regions for the semiconductor source of FIG. 9, illustrating the fundamental mode (mode 4) and higher order modes.

Conventional ARROW devices have been found to work well (including single mode high power devices) as long as the core element width $d_{core}$ is less than or equal to about 4 µm. Above this width for the core element, significant problems are encountered, since a high order mode can be excited at high drive levels. 2D calculations done in MODEM for a single core ARROW device in accordance with the present invention with Γ=1.45%, Δn=0.022, and with various core widths $d_{core}$ up to 10 µm, show that significant improvements over conventional ARROW structures can be obtained. The results of calculations for $d_{core}$=10 µm, an emission wavelength λ=0.98 µm, and a width s of the reflecting interelement regions 59 equal to 2.5 µm, are shown in FIG. 11, which illustrates for the fundamental mode (mode 4) and first order and higher modes edge radiation losses versus the GaAs passive guide layer (layer 50) thickness in the lateral clad regions 59. For $d_c$=10 µm, the fundamental mode has very small losses (less than 1 cm$^{-1}$), which is much less than for the S-ARROW. Intermodal discrimination is high, in the range of 10 to 15 cm$^{-1}$ over a wide range in passive-guide layer thickness. Although mode 7 may be a problem above threshold, a tapered ARROW structure may be utilized, as shown in FIG. 10, because mode 7 is too lossy to be a problem if $d_c$ is less than about 6 µm, and thus a tapered ARROW design with $d_{c,back}$=4 µm and $d_{c,front}$=10 µm will suppress mode 7. Again, a lasing spot size having an area at least five times greater than that of a conventional ARROW device is obtained.

Figure 12:
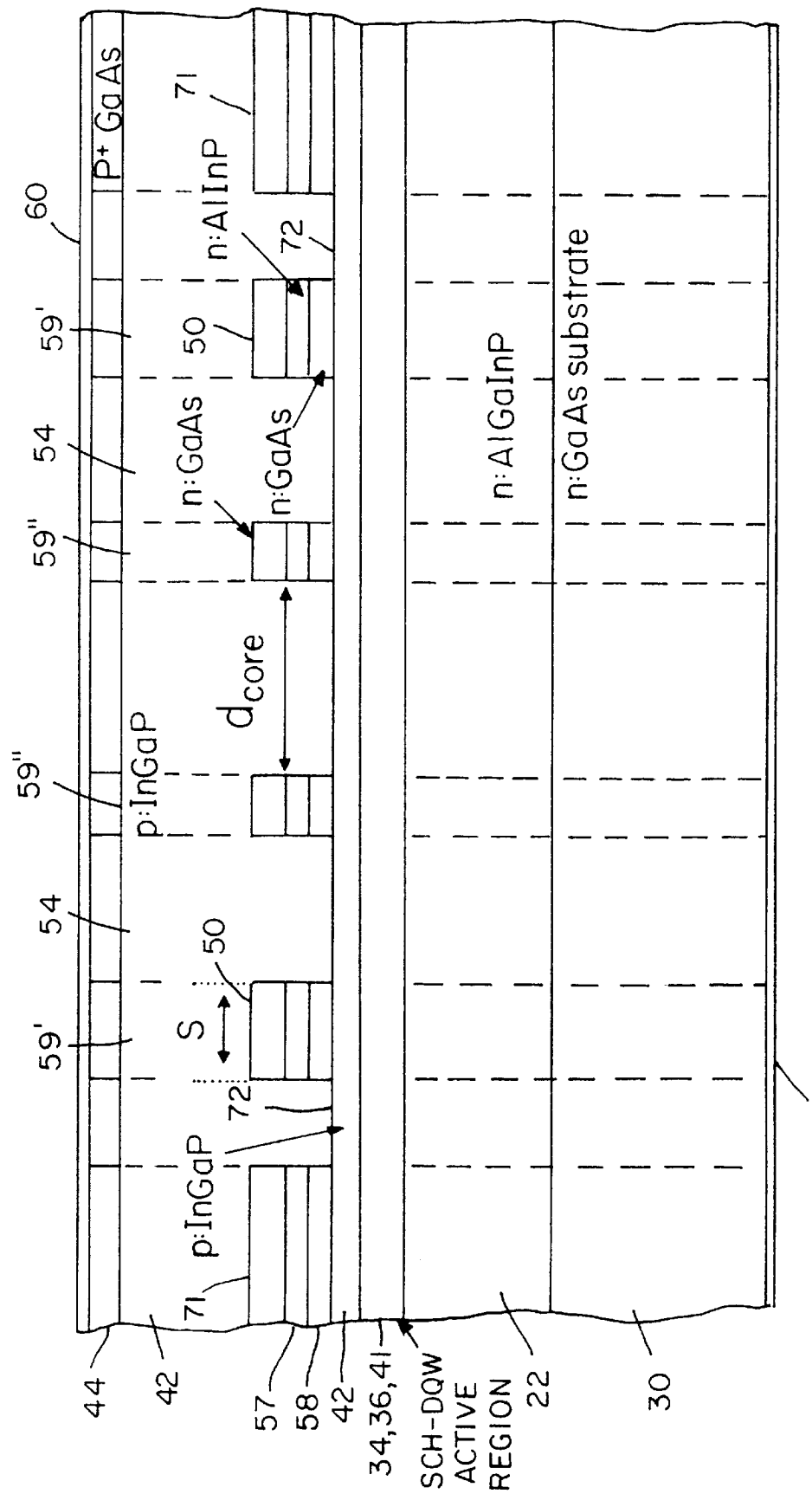
FIG. 12 is an illustrative cross-sectional view of a semiconductor source in accordance with the invention having a triple core ARROW lateral structure.
Figure 13:
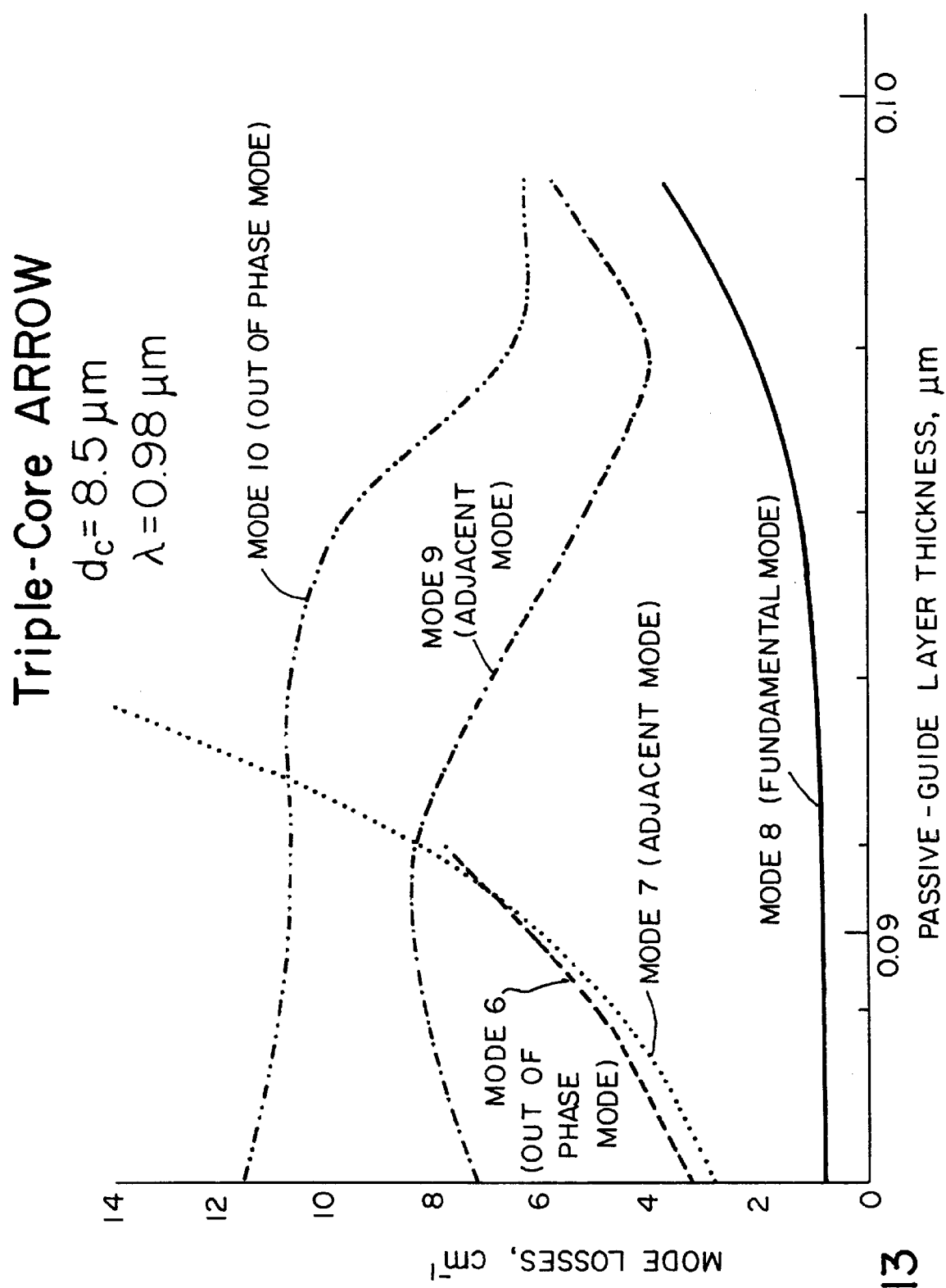
FIG. 13 are graphs illustrating calculated edge reflection losses as a function of passive waveguide thickness for the semiconductor source of FIG. 12 with a core width of 8.5 $\mu$m for the fundamental mode (mode 8), adjacent modes, and out-of-phase modes.
Figure 14:
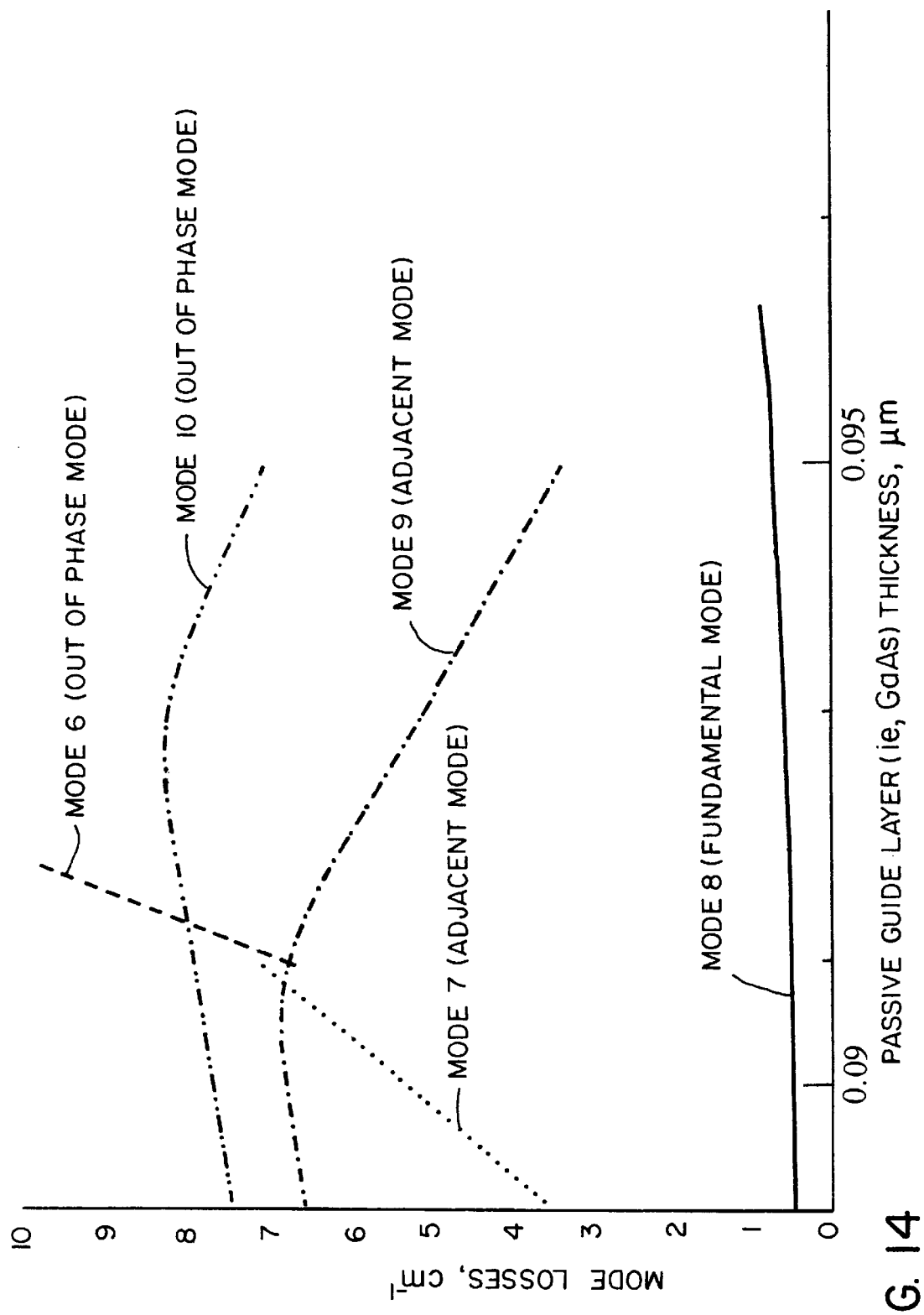
FIG. 14 are calculated graphs for the laser of FIG. 12 as in FIG. 13 calculated for a core width of 10 $\mu$m.

The present invention may also be incorporated into multi-core (e.g., three core) ARROW devices. An example of a three-core ARROW structure in accordance with the invention is illustrated in FIG. 12. All interelement regions have the transverse structure shown in FIG. 5. The three core elements 54 are separated by interelement regions 59" which have the same multilayer structure as the boundary interelement regions 59'. The ARROW edge structures defined by the layers 71, 57 and 58 and the gap 72 are similar to the ARROW structure of FIG. 9 with the exception that layer 71 includes the absorbing layer 52 shown in FIG. 5. For a triple-core ARROW device, the aperture is three times larger than for an S-ARROW or a conventional single-core ARROW device, but only about 60% of the light resides in the far-field central lobe. Thus, about twice the single mode power is obtained compared to S-ARROW and ARROW devices, with 2 W CW diffraction-limited power being obtainable. Graphs illustrating calculated mode losses versus passive guide thicknesses for the triple-core ARROW are shown in FIG. 13 for a core element width equal to 8.5 µm and in FIG. 14 for a core element width of 10 µm. For both sets of calculations, the width of the boundary interelement regions 59" is 2.55 µm and the width of the interelement regions 59" is 1.7 µm, which corresponds approximately to resonant optical transmission between the three core elements. For a core element 54 width equal to 10 µm, it is seen that the in-phase mode (the fundamental mode) has low loss, about 0.5 cm$^{-1}$, and that the intermodal discrimination is large (greater than 4 cm$^{-1}$) over a wide range in guide-layer thickness variation (due to about 66 cm$^{-1}$ interelement absorption loss). It is seen that the spot size for such devices is again about five times that of the conventional triple-core ARROW device. The structure of multi-core and particularly three-core ARROW devices with interelement loss is described in the aforesaid U.S. Pat. No. 5,606,570 to Botez, et al., entitled "High Power Antiguided Semiconductor Laser With Interelement Loss.")

The present invention may also be incorporated in ROW arrays. Typically, a 20 element, 120 µm aperture antiguided array (a so-called ROW array) will provide 0.5 to 0.6 W coherent reliable power. Tripling or quadrupling the value of d/Γ the reliable power scales accordingly to 1.5 to 2 W. By utilizing nonabsorbing mirrors, it is possible to increase the reliable coherent power to 3–5 W.

For conventional flared-antiguided MOPA's 130 µm wide aperture devices have been demonstrated as shown in D. Botez, M. Jansen, C. Zmudzinski, L. J. Mawst, P. Hayashida, C. Tu and R. Nabiev, "Flat-Phase Front Fanout-Type Power Amplifier Employing Resonant-Optical-Waveguide Structures, Appl. Phys. Lett., Vol. 63, No. 23, December 1993, pp. 3113–3115. By tripling or quadrupling the transverse spot size in accordance with the present invention, and using nonabsorbing mirrors, the reliable power obtainable with such devices may be increased to 3 to 5 W of reliable spatially and temporally coherent power.

The invention may also be applied to ARROW amplifiers, which comprise ARROW or S-ARROW devices. The devices with Γ=1.45% and Δn=0.022 may be utilized with up to 10 µm wide core element size $d_c$. The same structure is utilized for amplifiers as was described above for lasers except that the end facets are anti-reflective (AR) coated (preferably less than 0.1% reflectivity) to prevent lasing oscillation. Another alternative for amplifiers is to utilize angle-striped devices (2–7° with respect to the cleaved facets) with low reflective (LR) coating (about 1% reflectivity). Because the spot size of a single-mode device increases five-fold, the implications are that for unsaturated regime amplifier devices (e.g., for fiber optic communications), the saturated power ($P_{sat}$) will increase five times to 50 mW compared to a conventional value of 10 mW. Such power levels will enable transparent switching networks utilizing such devices. For saturated-regime devices, 2 to 4 mm long devices will provide 0.8–1.0 W amplified power. By utilizing proper facet passivation, such power may be delivered reliably, enabling high powered tunable single-frequency sources (for example, where the amplifier is placed at the output of an external-cavity-controlled diode laser).

As a further alternative, the low index core element may be formed asymmetrically in the transverse direction but of two waveguides rather than one: a narrow guide incorporating the active region and a wide guide to spread out the mode and make it asymmetric with respect to the active region, as illustrated in FIG. 15. The core element region may include an index profile as illustrated in FIG. 15 having a base index level 80, a light trap at a higher index level 81 separated from an active region and confinement layers 82 by a lower index level region 83, and an upwardly adjacent layer at again a lower index level 84. The resulting optical mode profile is illustrated by the graph 86. The light trap has a width such that d√Δ (n²) is less than λ/4. The interelement region shown in FIG. 16 has an additional light trap layer 87 that is separated from the active region/confinement layers 82, with a field distribution as illustrated by the graph 88 in FIG. 16. The field distributions provide enough overlap for effective lateral antiguiding.

Figure 18:
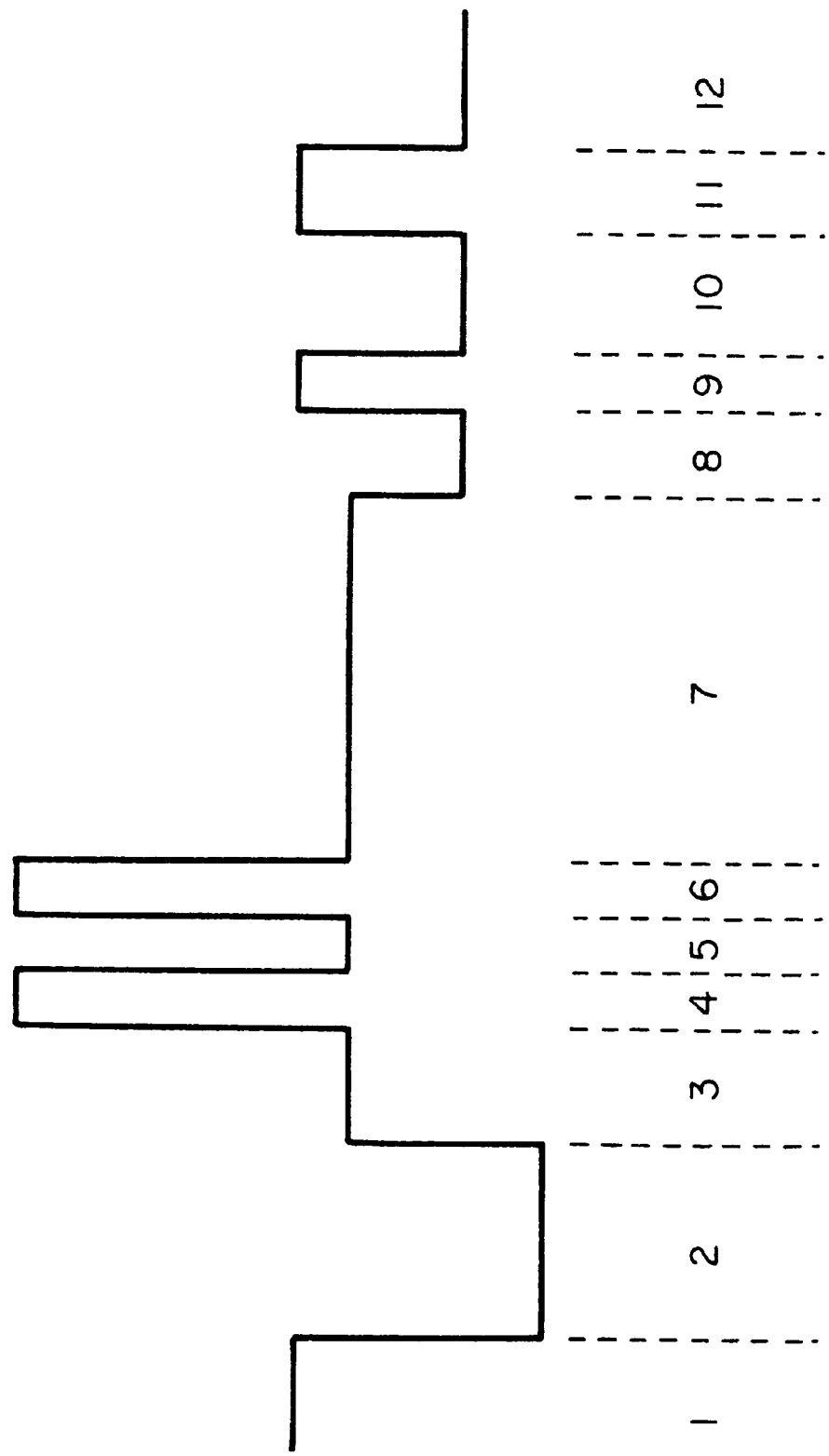
FIG. 18 is an exemplary transverse index of refraction profile in the core element for the source structure of FIG. 17.

The present invention may also be incorporated in aluminum based devices, e.g., AlGaAs based. A schematic structure for an S-ARROW device in such a material system is illustrated in FIG. 17. This device includes an AlGaAs n-type cladding layer 90, a confinement layer 91, a double quantum well active region 92, and an upper confinement layer 93. The structure of FIG. 17 has a further AlGaAs layer 94 within which is formed a stop-etch layer 96 of GaAs. Additional layers of GaAs 97 and GaAs 98 are formed over it, with wells 99 formed at spaced positions, as described further below. The structure further includes a p-type cladding layer 100 of AlGaAs and a p+ capping layer of GaAs 101. Current confinement may be obtained by utilizing V-grooves (e.g., 2–3 µm wide) outside the high-index regions, together with oxide-defined stripes, a preferential Zn diffusion (as illustrated in FIG. 7), proton implantations, or oxide-defined stripes narrower than the core region. Conducting electrodes 103 and 104 may be formed on the top and bottom of the structure to apply power thereto, as desired, with the former made taking into account the current confinement scheme. The core element 105 is defined between the wells 99, which themselves define the interelement regions 106. An exemplary confinement layer, active region and cladding layer structure diagram in FIG. 18, illustrates the index profile for such a structure in the core element region, and FIG. 19 illustrates the exemplary constituents and thicknesses of the layers for both the core element region 105 (FIG. 17), as well as for the interelement region 106. The following key parameters are used: Γ=1.38%, $d_c$=10 µm, interelement region width s≈2.5 µm, and index step Δn≈0.023 (in the 2-D MODEM calculation).

It is understood that the invention is not confined to the particular embodiments set forth herein as illustrative, but embraces all such forms thereof that come within the scope of the following claims.

What is claimed is:

1. A semiconductor light emitting source comprising:
    (a) a semiconductor structure including in a transverse direction a substrate, an active region, and optical confinement layers and cladding layers on each side of the active region to surround the active region;
    (b) the semiconductor structure including at least one core element at which light emission occurs and interelement regions laterally adjacent to the core element, the core element having a selected effective refractive index to the emitted light, the effective refractive index of the interelement regions being higher than the effective refractive index of the core element to provide effective antiguiding of light emitted in the core element; and
    (c) the optical confinement and cladding layers on opposite sides of the active region having different indexes of refraction to provide an optical waveguiding structure in the transverse direction in the core element which is asymmetrical and which favors lasing only in the fundamental transverse mode.

2. The semiconductor source of claim 1 wherein the confinement and cladding layers provide a transverse optical confinement factor in the active region of less than about 2%, and wherein there is an effective refractive index step between the core element and the interelement regions lower than about 0.05 and an attenuation coefficient in the interelement regions lower than about 100 cm$^{-1}$.

3. The semiconductor source of claim 1 wherein the lateral index step between the core element and the interelement regions is at least 1×10$^{-2}$.

4. The semiconductor source of claim 1 including means for providing optical feedback to provide lasing action in the core elements.

5. The semiconductor source of claim 4 wherein the means for providing optical feedback includes facets at longitudinal edges of the semiconductor structure perpendicular to the core element and interelement regions, the facets having mirrored surfaces to reflect light back into the core element.

6. The semiconductor source of claim 1 wherein the interelement regions have an active region and confinement and cladding layers and wherein one cladding layer in the interelement regions on one side of the active region is formed to have a higher effective index than the adjacent cladding layer in the core element to provide for the fundamental transverse mode an effective index in the interelement regions that is higher than the effective index in the core element.

7. The semiconductor source of claim 1 wherein there is one core element and the interelement regions define boundary regions laterally on each side of the core element of width corresponding approximately to the antiresonance condition for the fundamental lateral mode to provide a simplified ARROW configuration.

8. The semiconductor source of claim 1 wherein there is a single core element and the interelement regions comprise elements of ARROW reflectors formed in the semiconductor structure laterally adjacent to the core element.

9. The semiconductor source of claim 8 wherein the lateral width of the core element and ARROW reflectors changes longitudinally to provide a tapered ARROW structure.

10. The semiconductor source of claim 1 comprises a triple core ARROW structure having three core elements separated by interelement regions and interelement regions comprising elements of lateral ARROW reflectors formed in the semiconductor structure laterally on each side of the triple core.

11. The semiconductor source of claim 1 wherein there are a plurality of core elements separated by interelement regions to define a ROW array.

12. The semiconductor source of claim 1 wherein there are a plurality of core elements separated by interelement regions configured to define a flared, antiguided MOPA.

13. The semiconductor source of claim 1 wherein there are multiple core elements separated by interelement regions, and facets at the edges of the semiconductor structure which are sufficiently antireflective so that the semiconductor source operates as an ARROW amplifier.

14. The semiconductor structure of claim 13 wherein the stripes are angled with respect to the cleaved facets.

15. The semiconductor source of claim 1 wherein the active region includes a double quantum well.

16. The semiconductor source of claim 1 wherein the semiconductor structure has outer faces and electrodes on the outer faces by which current can be applied across the semiconductor structure.

17. The semiconductor source of claim 16 including means for restricting the current applied between the faces of the semiconductor structure to the core element.

18. The semiconductor source of claim 17 wherein the means for restricting the current comprises p-n junction regions defined in semiconductor layers in the interelement regions that are back biased to block current flow across the p-n junctions.

19. The semiconductor source of claim 17 wherein the means for restricting the current comprises oxide defined stripe openings formed above the core element regions.

20. The semiconductor source of claim 17 wherein the means for restricting the current comprises layers defining a back biased p-n junction extending across the semiconductor structure and a preferential diffusion of a conductive impurity through a face of the semiconductor structure above the core element and through the p-n junction to provide conductive continuity through the junction above the core element.

21. The semiconductor source of claim 17 wherein the means for restricting the current comprises selectively oxidized thin layers of Al-containing compound formed on at least one side of the active region to define a stripe opening adjacent the core element region.

22. The semiconductor source of claim 21 wherein the selectively oxidized thin layers of Al-containing compound are embedded within a cladding layer.

* * * * *